United States Patent [19]

Aubert et al.

[11] Patent Number: 4,915,869

[45] Date of Patent: Apr. 10, 1990

[54] MIXED LANTHANUM-MAGNESIUM ALUMINATES

[75] Inventors: Jean-Jacques Aubert, Saint Egreve; Maurice Couchaud, Seyssinet-Pariset; Anne-Marie Lejus, Montrouge; Daniel Vivien, Garches, all of France

[73] Assignees: Commissariat a l'Energie Atomique; Centre National de la Recherche Scientifique, both of Paris, France

[21] Appl. No.: 292,636

[22] Filed: Dec. 30, 1988

Related U.S. Application Data

[63] Continuation of Ser. No. 919,131, Oct. 15, 1986, abandoned.

[30] Foreign Application Priority Data

Oct. 21, 1985 [FR] France ............................ 85 15579

[51] Int. Cl.$^4$ .............................................. C09K 11/80
[52] U.S. Cl. .............................................. 252/301.4 R
[58] Field of Search .................................. 252/301.4 R

[56] References Cited

U.S. PATENT DOCUMENTS

| 4,249,108 | 2/1981 | Wolfe | 252/301.4 R |
| 4,606,846 | 8/1986 | Kahn et al. | 252/301.4 R |
| 4,631,144 | 12/1986 | Beers et al. | 252/301.4 R |

FOREIGN PATENT DOCUMENTS 2442264  6/1980  France .

OTHER PUBLICATIONS

Journal of Applied Physics, vol. 52, No. 11, Nov. 1981.

Primary Examiner—Jack Cooper
Attorney, Agent, or Firm—Michael N. Meller

[57] ABSTRACT

Mixed lathanum-magnesium aluminates, their production process and lasers using these aluminates.

These lasers comprise two flash lamps for longitudinally pumping a bar of an aluminate of formula $La_{1-x}Nd_xMg_yAl_{11}O_{18+y}$, x and y being numbers such that $0 < x \leq 0.2$ and $0 < y < 1$, preferably with y ranging from 0.5 to 0.55, emitting in the infrared, mirrors for amplifying the light emitted by the bar and a polarizing prism for passing the amplified light beam outside the laser.

7 Claims, 1 Drawing Sheet

MIXED LANTHANUM-MAGNESIUM ALUMINATES

This application is a continuation of application Ser. No. 919,131 filed 10/15/86, now abandoned.

The present invention relates to mixed aluminates of lanthanum and magnesium obtained in the form of monocrystals, as well as to the production process for the same.

These mixed aluminates are used in the field of microlasers for integrated optics or telecommunications by optical fibres, as well as in the field of continuous or pulsed power lasers mainly emitting in the infrared at wavelengths of 1.054 to 1.080 $\mu m$, with a certain degree of tuning of the wavelengths, as well as in the vicinity of 1.3 $\mu m$. These power lasers emitting in the infrared in particular make it possible to carry out work on materials (welding, drilling, marking, surface treatment), photochemical reactions and controlled thermonuclear fusion.

At present mixed aluminates of lanthanum and magnesium are known complying with the general formula $La_{1-x}Nd_xMgAl_{11}O_{19}$ in which x is a positive number equal to or below 1. As aluminates, particular reference is made to that complying with the formula $La_{0.9}Nd_{0.1}MgAl_{11}O_{19}$. Such mixed aluminates are more particularly described in EP-A-0 043 776.

The mixed aluminate for which x is equal to 0.1 is particularly suitable as a laser emitter, because it has optical properties comparable to those of yttrium and aluminum garnet of formula $Y_3Al_5O_{12}$, known as YAG, in which 1% of the yttrium ions are replaced by neodymium ions and neodymium ultraphosphate of formula $NdP_5O_{14}$, widely used as emitters for lasers operating in the infrared.

The aforementioned mixed aluminates and particularly that of composition $La_{1-x}Nd_xMgAl_{11}O_{19}$ can be prepared in the form of monocrystals by the Verneuil method, the Czochralski method or any other crystallogenesis method based on a molten bath of the aluminate, in order to give the laser effect.

Unfortunately, these mixed aluminates do not have a so-called congruent melt, i.e. the monocrystal does not have the same composition as the molten bath. Therefore the production of monocrystals of these aluminates, particularly by the most widely used Czochralski method leads to crystals of inadequate quality (bubbles, faults) as soon as it is a question of attaining the large sizes required by the power laser industry (100 mm long, diameter 6.35 mm bar).

SUMMARY OF THE INVENTION

The present invention relates to novel mixed lanthanum-magnesium aluminates which can be produced in the form of large monocrystals and which can therefore be used by the power laser industry.

According to the main feature of the invention, these mixed lanthanum-magnesium aluminates are characterized in that they comply with the following formula:

$$La_{1-x}Nd_xMg_yAl_{11}O_{18+y}$$

in which x and y have numbers such that $0 < x \leq 0.2$ and $0 < y < 1$.

These monophase mixed aluminates have a crystalline structure, of the magnetoplumbite type, with a hexagonal mesh. They have mechanical and thermal properties close to those of alumina.

According to the invention, these aluminates have a congruent melt and the crystals produced by the Czochralski method, which is the most widely used in the industry are of good quality. It is then possible to prepare the large monocrystals required by the power laser industry.

During the growth of a monocrystal, these mixed aluminates also do not suffer from segregation of the constituents making it possible to increase the monocrystal pulling speed compared with known mixed aluminates. This leads to a significant reduction in the monocrystal preparation time and in the life of the crucibles containing the bath and from which pulling takes place.

Advantageously, the mixed aluminates according to the invention have a composition such that y is between 0.4 and 0.7 and is preferably at least equal to 0.5 and at the most equal to 0.55. Particular reference is made to the compound of formula $La_{0.9}Nd_{0.1}Mg_{0.52}Al_{11}O_{18.52}$.

When x is close to 0.1, the mixed aluminates according to the invention can be used as continuously operating power laser emitters. In the same way when x is close to 0.2, the mixed aluminates according to the invention can be used as pulsed power laser emitters.

The mixed aluminates according to the invention can be obtained on the basis of a first production process, wherein intimate mixing takes place in appropriate proportions of powders of the oxides $La_2O_3$, $Nd_2O_3$, MgO and $Al_2O_3$, followed by calcining, melting the mixture obtained and treating the molten mixture to obtain, by solidification thereof, a monocrystal. This process is easy to perform.

Generally calcining is performed at between 1500° and 1600° C. and makes it possible to eliminate any trace of water. Following calcining, the powder mixture is ground. To facilitate the homogenization of the mixture, powders are used having a grain size between 1 and 10 $\mu m$.

The mixed aluminates according to the invention can also be obtained on the basis of a second production process, wherein coprecipitation takes place of hydroxides of the ions $La^{3+}$, $Nd^{3+}$, $Mg^{2+}$ and $Al^{3+}$ dissolved in the form of salts in an aqueous or non-aqueous solvent in appropriate proportions, followed by calcining, melting the coprecipitate obtained and treating the molten coprecipitate so as to obtain, by solidification of the coprecipitate, a monocrystal. This second process which is as easy to perform as the first has the interest of giving a very homogeneous mixture.

In order to carry out the coprecipitation of the hydroxides, it is e.g. possible to prepare a solution formed from $Nd_2O_3$, $La_2O_3$ and MgO dissolved in dilute nitric acid, so as to obtain the corresponding nitrates. A suspension of $Al_2O_3$ is added to the solution. This is followed by the coprecipitation of the hydroxides, particularly with ammonia.

In this second process, calcining is performed at about 1200° C. In particular it makes it possible to eliminate the ammonium nitrate ($NH_4NO_3$) formed during ammonia addition. Following this calcining, the coprecipitate is ground.

To form a monocrystal form the molten bath of the same composition as that of the desired monocrystal, it is possible to use all known crystallogenesis methods which employ a molten bath, such as the Verneuil, molten zone, Bridgmann or Czochralski methods.

The monocrystals obtained according to the processes of the invention have a laser effect in the infrared range. The laser effect increases with the purity of the monocrystals obtained.

In order to obtain the maximum possible output efficiency, the starting materials used must be very pure. In particular, the starting powders must have a purity level exceeding 99.98%.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

A description will now be given of the production of monocrystals by the Czochralski method in an iridium crucible from mixed aluminates according to the invention and complying with the formulas given in the left-hand part of the following table. These aluminates are produced in the dry phase by mixing powders of oxides $La_2O_3$, $Nd_2O_3$, MgO and $Al_2O_3$. The powder quantities used are given in the left-hand part of the table. The relative quantities of the powders are determined by weighing in a two liter polyethylene bottle or flask.

The starting material used can be the RHONE-POULENC $La_2O_3$ and $Nd_2O_3$ powder having respective purity levels of 99.999% and 99.9990%, MgO powder marketed by JMC under the name Gdl with a purity level of 99.999% and $Al_2O_3$ powder produced by CRICERAM and marketed under the name "exalα" with a 99.98% purity level.

As lanthanum and neodymium oxides are very hygroscopic, it is firstly necessary to calcine them before mixing them with the alumina. This calcination takes place in an alumina crucible for 16 hours at a temperature of 1100° C.

Magnesia and alumina powders are added to the La and Nd oxides calcined in the alumina crucible. This is followed by homogenization of the powder mixture by stirring for 24 h. This mixture is them compacted by isostatic compression in a diameter 70 mm latex envelope under a pressure of 2 kilobars. Annealing takes place for 20 hours at 1550° C. in the alumina crucible.

The thus obtained mixed aluminate powder is then placed in a 60 mm top, 60 mm diameter iridium crucible and, protected from the oxygen of the air, is raised to a melting point equal to 1810° C. in order to form a molten aluminate bath.

A monocrystalline nucleus of the same composition as the molten bath cut parallel either to the crystallographic direction c, or to the direction a of the hexagonal mesh of the aluminate is then brought into contact with the liquid bath and slowly moved upwards, whilst effecting a rotary movement on itself. The pulling speed, which exceeds that of known aluminates, is 1 mm/h and the rotation speed 30 r.p.m. Thus, the monocrystal is formed progressively at the end of the nucleus, as a function of the direction imposed thereon.

Using this pulling procedure, diameter 25 mm and length 100 mm aluminate bars were obtained.

| EXAMPLES OF MONOCRYSTALS OBTAINED BY CZOCHRALSKI PULLING | | | | |
|---|---|---|---|---|
| Powder quantities in g | | | | |
| $La_2O_3$ | $Nd_2O_3$ | MgO | $Al_2O_3$ | Crystal obtained |
| 97.75 | 11.22 | 13.97 | 373.86 | $La_{0.9}Nd_{0.1}Mg_{0.52}Al_{11}O_{18.52}$ |
| 97.75 | 11.22 | 16.20 | 373.86 | $La_{0.9}Nd_{0.1}Mg_{0.6}Al_{11}O_{18.6}$ |
| 97.75 | 11.22 | 21.60 | 373.86 | $La_{0.9}Nd_{0.1}Mg_{0.8}Al_{11}O_{18.8}$ |
| 97.75 | 11.22 | 12.15 | 373.86 | $La_{0.9}Nd_{0.1}Mg_{0.45}Al_{11}O_{18.45}$ |
| 92.32 | 16.83 | 13.43 | 373.86 | $La_{0.85}Nd_{0.15}Mg_{0.5}Al_{11}O_{18.5}$ |
| 92.32 | 16.83 | 18.81 | 373.86 | $La_{0.85}Nd_{0.15}Mg_{0.7}Al_{11}O_{18.7}$ |

Figure 1:
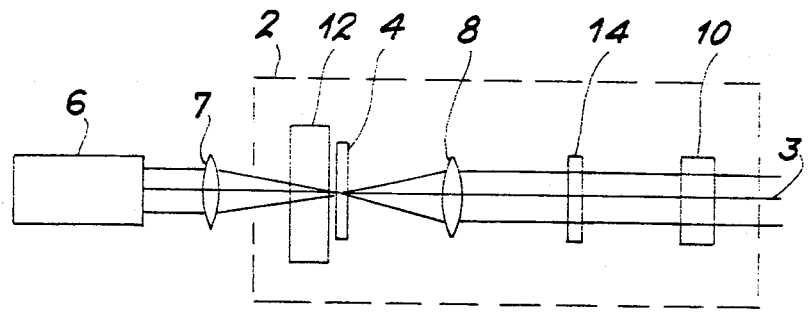
FIG. 1 diagrammatically a continuous laser using an aluminate monocrystal according to the invention.
Figure 2:
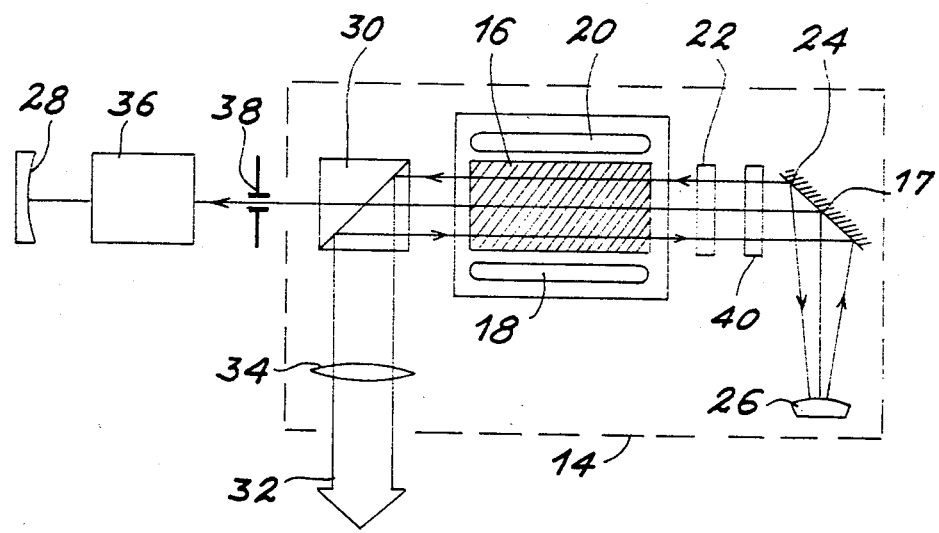
FIG. 2 diagrammatically a pulsed power laser using an aluminate monocrystal according to the invention.

FIG. 1 diagrammatically shows a continuous power laser emitting in the infrared and using an aluminate monocrystal according to the invention. The emission wavelengths are 1054, 1083 and 1320 nm.

This laser comprises a laser cavity 2 containing an aluminate bar 4 according to the invention positioned perpendicular to the longitudinal axis 3 of the laser. This aluminate bar 4 is e.g. of formula $$La_{0.9}Nd_{0.1}Mg_{0.52}Al_{11}O_{18.52}$$

A monochromatic light source 6, such as an ionized krypton or argon laser, makes it possible to irradiate the aluminate bar 4, via a convergent lens 7, in order to ensure the optical pumping of bar 4.

Laser cavity 2 also comprises a convergent lens 8 transforming the light emitted by the aluminate bar 4 into a parallel light beam, which is then passed onto an exit mirror 10.

Following reflection on mirror 10, the light beam again passes through the convergent lens 8 and the amplifying medium or aluminate bar 4. The amplified laser beam is then reflected by a dichroic entrance mirror 12, in the vicinity of which is placed bar 4. Mirror 12 is transparent to the light emitted by monochromatic source 6 and opaque to that emitted by aluminate crystal 4.

The laser beam adequately amplified in cavity 10 is then passed towards the outside of the laser, via mirror 10, which is partly transparent to the light emitted by aluminate monocrystal 4.

The wavelength tunability can be obtained with the aid of a wavelength selection system 14 placed between convergent lens 8 and exit mirror 10 of laser cavity 2, said system being of the Brewster angle prism or interference filter type formed from two birefringent material plates.

This pulsed laser comprises a cavity 4 containing a monocrystalline bar 16 of an aluminate according to the invention arranged parallel to the longitudinal axis 17 of the laser. This aluminate is e.g. of formula $$La_{0.8}Nd_{0.2}Mg_yAl_{11}O_{18+y} \text{ with } 0.4<y<0.7.$$

On either side of bar 16 are arranged high intensity, elongated, xenon flash lamps 18, 20, also oriented in accordance with laser axis 17. These lamps also ensure a longitudinal optical pumping of aluminate bar 16. Laser cavity 14 also comprises a quarter-wave plate 22 which converts the linearly polarized incident light from bar 16 into a circularly polarized light. Plate 22 is followed by a plane mirror 24 and a divergent convex mirror 26.

Following reflection on mirror 26 the circularly polarized, adapted, widened light beam again traverses the quarter-wave plate 22, thus producing a vertically polarized beam, which completely sweeps the amplifying medium or bar 16, whilst extracting therefrom the maximum light energy.

The amplified laser beam propagating in the direction of a concave, highly reflecting mirror 28 is interrupted by a polarizing prism 30 ejecting the vertically polarized beam 32 out of the laser cavity. A convergent lens 34 makes it possible to obtain a parallel light beam.

This pulsed laser is equipped with an electrooptical switch 36, which is more commonly known as "$Q_1$ switch", positioned between concave mirror 38 and exit polarizer 30. When this switch is closed, i.e. when a voltage is applied thereto, the laser cannot operate. Thus, during "pumping" the amplifying medium with lamps 18 and 20, polarizer 30 is transparent to the horizontally polarized photons and allows light to pass to switch 36. The latter rotates the polarization direction by 90° and prevents polarizer 30 from transmitting said light.

Conversely, on opening electrooptical switch 36, the latter no longer impairs the horizontal polarization from the polarizer, so that the laser cavity 14 can amplify the light emitted by bar 16.

A diaphragm 38 can be placed between the switch and the polarizer for channelling the laser light.

To obtain a wavelength-tunable pulsed laser, a wavelength selection device 40, like that described hereinbefore, can be placed between plate 22 and mirror 24.

The lasers described hereinbefore have only been given in an illustrative manner and other laser types can also be equipped with an aluminate monocrystal according to the invention.

The aluminate monocrystals according to the invention can be used in all applications presently employing a laser emitter of the YAG type. In particular, these monocrystals can be used for lasers intended for the cutting or marking of material, as well as for producing welds.

The cutting of the material is ensured by placing a monocrystalline aluminate in the cavity of a laser, as described hereinbefore, by then orienting and focusing on the surface of the material the light from the laser in order to bring said material locally to its melting point, thus ensuring its cutting as it moves in the laser beam.

Apart from applications of the YAG type, the aluminates according to the invention have their own special applications, which are more particularly linked with the main laser emission wavelength of 1.054 μm. This wavelength can be used for triggering the laser effect of phosphate and fluophosphate glasses used as amplifier stages in systems for the study of controlled thermonuclear fusion according to the inertial confinement method. In the field of this particular application, the aluminate according to the invention is consequently in competition with the lithium and yttrium fluoride of formula $LiYF_4$, which is doped with neodymium and at present generally used.

What is claimed is:

1. A monocrystalline mixed aluminate of lanthanum and magnesium of the general formula:

$$La_{1-x}Nd_xMg_yAl_{11}O_{18+y}$$

in which x is a number such that $0 < x \leq 0.2$ and y is a number such that $0.5 \leq y < 0.7$ and wherein said mixed aluminate has a magnetoplumbite crystalline structure.

2. An aluminate according to claim 1 wherein x is equal to 0.1.

3. An aluminate according to claim 1, wherein said aluminate has the formula:

$$La_{0.9}Nd_{0.1}Mg_{0.52}Al_{11}O_{18.52}.$$

4. An aluminate according to claim 1, wherein x is equal to 0.2.

5. A monocrystalline mixed aluminate of lanthanum and magnesium of the general formula:

$$La_{1-x}Nd_xMg_yAl_{11}O_{18+y}$$

in which x and y represent numbers such that $0 < x \leq 0.2$ and $0.5 \leq y \leq 0.55$ and wherein said aluminate has a magnetoplumbite crystalline structure.

6. An aluminate according to claim 5, wherein x is equal to 0.1.

7. An aluminate according to claim 5, wherein x is equal to 0.2.

* * * * *